US011832417B2

(12) United States Patent
Chen et al.

(10) Patent No.: US 11,832,417 B2
(45) Date of Patent: Nov. 28, 2023

(54) SUPPORT BRACKET FOR LIQUID COOLING COLD PLATE MECHANISM

(71) Applicant: QUANTA COMPUTER INC., Taoyuan (TW)

(72) Inventors: Chao-Jung Chen, Taoyuan (TW); Kun-Pei Liu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 37 days.

(21) Appl. No.: 17/464,504

(22) Filed: Sep. 1, 2021

(65) Prior Publication Data

US 2022/0377938 A1 Nov. 24, 2022

Related U.S. Application Data

(60) Provisional application No. 63/191,629, filed on May 21, 2021.

(51) Int. Cl.
*H05K 7/20* (2006.01)

(52) U.S. Cl.
CPC ..... *H05K 7/20254* (2013.01); *H05K 7/20272* (2013.01); *H05K 7/20772* (2013.01)

(58) Field of Classification Search
CPC .......... H05K 7/20254; H05K 7/20272; H05K 7/20772; H05K 7/20281; H05K 7/1488; H05K 7/2039; G06F 1/203; G06F 1/20
See application file for complete search history.

(56) References Cited

U.S. PATENT DOCUMENTS

| | | | | |
|---|---|---|---|---|
| 6,213,806 B1* | 4/2001 | Choy | ................... | H05K 7/1069 439/73 |
| 6,447,322 B1* | 9/2002 | Yan | ...................... | H05K 7/1053 361/709 |
| 7,914,313 B1* | 3/2011 | Ramsey | ............... | G01R 1/0466 439/71 |
| 7,929,317 B2* | 4/2011 | Cheng | .................. | H05K 7/1429 361/801 |

(Continued)

FOREIGN PATENT DOCUMENTS

| | | | |
|---|---|---|---|
| CN | 114252204 A | * | 3/2022 |
| JP | 4787309 B2 | * | 10/2011 |

(Continued)

OTHER PUBLICATIONS

JP-4787309-B2 Translation.*

(Continued)

*Primary Examiner* — Jacob R Crum
*Assistant Examiner* — Matthew Sinclair Muir
(74) *Attorney, Agent, or Firm* — NIXON PEABODY LLP

(57) ABSTRACT

A computing system includes a chassis, a circuit board including at least one electronic component, a mounting bracket secured to the chassis, a support bracket pivotably coupled to the mounting bracket, and a cold plate coupled to the support bracket. The support bracket is pivotable between a first configuration and a second configuration. The cold plate is in contact with the at least one electronic component in the first configuration, and the cold plate is removed from contact with the at least one electronic component in the second configuration.

20 Claims, 7 Drawing Sheets

(56) References Cited

U.S. PATENT DOCUMENTS

| | | | | |
|---|---|---|---|---|
| 2014/0160679 A1* | 6/2014 | Kelty | ................... | G02B 6/4269 |
| | | | | 361/700 |
| 2020/0260615 A1* | 8/2020 | Leigh | ........................ | G06F 1/20 |
| 2020/0326060 A1* | 10/2020 | Fitch | ........................ | F21V 21/28 |
| 2022/0082771 A1* | 3/2022 | Galbraith | ............. | G02B 6/4269 |

FOREIGN PATENT DOCUMENTS

| | | | |
|---|---|---|---|
| JP | 2020507212 | A | 3/2020 |
| TW | M578471 | U | 5/2019 |
| TW | M578925 | U | 6/2019 |

OTHER PUBLICATIONS

CN-114252204-A Translation.*
TW Search Report for Application No. 110142088, dated May 12, 2022, w/ First Office Action.
TW Office Action for Application No. 110142088, dated May 12, 2022, w/ First Office Action with English translation.

* cited by examiner

SUPPORT BRACKET FOR LIQUID COOLING COLD PLATE MECHANISM

CROSS-REFERENCE TO RELATED APPLICATIONS

This application claims priority from and benefit of U.S. Provisional Patent Application Ser. No. 63/191,629, filed on May 21, 2021, titled "Liquid Cooling Coldplate Mechanism Design for CPU/GPU/Processer Etc Replacement by Better Service," which is hereby incorporated by reference herein in its entirety.

FIELD OF THE INVENTION

The present invention relates generally to heat management in computing systems, and more specifically, to a liquid cooling cold plate mechanism for improved access to electronic components in computing systems.

BACKGROUND OF THE INVENTION

Computing systems typically have electronic components housed in a chassis. Examples of computing systems include desktop computers, blade servers, rack-mount servers, etc. Computing systems generally generate heat in typical operation, therefore, heat management is employed. Heat management can be localized to some components and/or globalized to air surrounding all components within the computing system. Localized heat management is focused on specific hardware components of computing systems that generate heat, for example, processors, mechanical disks, power supplies, etc. Globalized heat management involves reducing ambient temperature within the chassis, for example, by expelling warmer air from within the chassis to the environment and drawing in cooler air from the environment into the chassis.

The goal of heat management is to cool electronic components of computing systems so that these components do not operate outside their respective ratings and/or do not become damaged due to excessive heating. Cooling electronic components allows computing systems to operate at peak efficiency. Heat sinks, fans, liquid cooling systems with heat exchangers, etc., are used in cooling specific electronic components. Components like processors, when liquid cooled, can be difficult to replace in the field. These components typically are contacted with cold plates that should first be removed in order to gain physical access to the components. The present disclosure provides solutions that at least reduce difficulty associated with gaining physical access to components of computing systems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a computing system includes a chassis, a circuit board including at least one electronic component, a mounting bracket secured to the chassis, a support bracket pivotably coupled to the mounting bracket, and a cold plate coupled to the support bracket. The support bracket is pivotable between a first configuration and a second configuration. The cold plate is in contact with the at least one electronic component in the first configuration, and the cold plate is removed from contact with the at least one electronic component in the second configuration.

In an implementation, the mounting bracket is secured to a floor of the chassis, and the support bracket is parallel to the floor of the chassis in the first configuration. In an implementation, the mounting bracket includes an edge that prevents the support bracket from pivoting when pivoting the support bracket from the first configuration to the second configuration. In an implementation, the contact between the cold plate and the at least one electronic component prevents the support bracket from over-rotating when in the first configuration.

In an implementation, the computing system further includes an inlet pipe and an outlet pipe, both coupled to the cold plate. The inlet pipe and the outlet pipe are routed lengthwise within the support bracket. In an implementation, the support bracket includes a pipe cover for holding the inlet pipe and the outlet pipe in place when the support bracket is pivoted between the first configuration and the second configuration. In an implementation, the support bracket includes a narrow frame portion and a wide frame portion. The narrow frame portion has a width that is smaller than the width of the wide frame portion and has a length that is larger than the length of the wide frame portion. In an implementation, the cold plate is coupled to the support bracket at the wide frame portion of the support bracket.

In an implementation, the cold plate includes flanges, and the support bracket is secured to the flanges via one or more fasteners. In an implementation, a pivot axis of the support bracket is provided a distance from the floor of the chassis. In an implementation, the pivot axis of the support bracket is adjustable to increase or decrease the distance from the floor of the chassis. The increase or decrease facilitates a varying thickness of the cold plate. In an implementation, the circuit board is a motherboard and the at least one electronic component is a processor. In an implementation, the support bracket includes a handle to facilitate pivoting the support bracket between the first configuration and the second configuration.

According to certain aspects of the present disclosure, a method for installing a cold plate in a computing system is provided. The method includes attaching the cold plate to a support bracket of the computing system. The method further includes pivotably coupling the support bracket of the computing system to a mounting bracket secured to a chassis of the computing system such that the support bracket is pivotable between a first configuration to a second configuration. The cold plate is in contact with at least one electronic component positioned on a circuit board of the computing system when the support bracket is in the first configuration and the cold plate is removed from contact with the at least one electronic component of the computing system when the support bracket is in the second configuration. The method further includes routing an inlet pipe and an outlet pipe to the cold plate. The inlet pipe and outlet pipe are routed along the length of the support bracket.

In an implementation, coupling the cold plate to the support bracket of the computing system includes: (a) positioning the support bracket at a distance from a floor of the chassis of the computing system; and (b) securing the support bracket to the mounting bracket with at least one fastener. In an implementation, the distance from the floor of the chassis is adjustable by changing a position of the at least one fastener. In an implementation, adjusting the distance from the floor of the chassis changes a pivot axis of the support bracket. In an implementation, the support bracket includes a handle to facilitate pivoting the support bracket between the first configuration and the second configuration. In an implementation, the mounting bracket includes an edge that prevents the support bracket from pivoting when configuring the support bracket from the first configuration to the second configuration. In an implementation, the inlet pipe and outlet pipe are bendable and remain routed along the length of the support bracket when the support bracket is in the first configuration and when the support bracket is in the second configuration.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
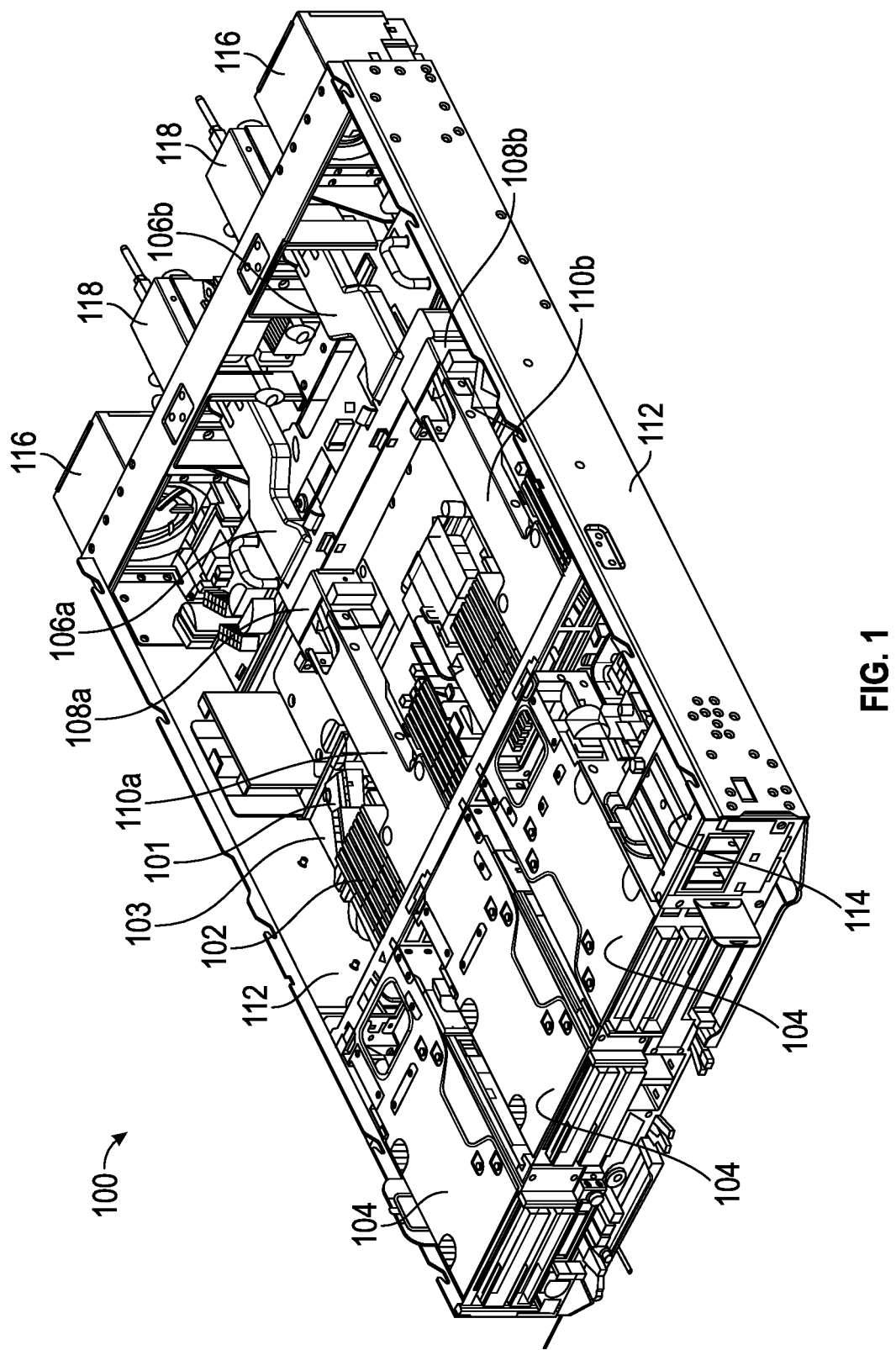
FIG. 1 is a perspective view showing a computing system with support brackets in a first configuration, according to certain aspects of the present disclosure.

Liquid cooling typically involves placing a cold plate in contact with an electronic component in order to facilitate heat transfer from the electronic component to the cold plate, and from the cold plate to a liquid cooling medium. The cold plate sometimes covers the entirety of the electronic component, thus preventing easy access to the electronic component. Furthermore, the cold plate generally requires channels to facilitate the flow of the liquid cooling medium through the cold plate. As a result, if a malfunctioning electronic component located underneath the cold plate requires replacement, swapping out the malfunctioning electronic component for a new electronic component can be difficult. This is because the cold plate and any tubing connected to the cold plate will have to be removed in order to gain access to the malfunctioning electronic component. Thus, embodiments of the present disclosure provide a cold plate attached to a rotatable support bracket. The rotatable support bracket, when rotated at a first end, lifts the cold plate from a first location to a second location. In the first location, the cold plate is directly in contact with an electronic component. In the second location, the cold plate is cleared from the location of the electronic component so that a support person has access to the electronic component.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Referring to FIG. 1, a computing system 100 according to certain aspects of the present disclosure is provided. The computing system 100 includes a chassis 112. The chassis 112 houses components of the computing system 100. The components can include, for example, a circuit board 101 (e.g., a motherboard) having memory slots 102, one or more riser card holders 104, one or more fans 116, a power supply 114, and one or more channels 106a, 106b for routing liquid for liquid cooling of the computing system 100. One or more pipe adaptors 118 are provided for connecting a liquid source (not shown) to the channels 106a, 106b. The computing system 100 includes one or more mounting brackets 108a, 108b. The mounting brackets 108a, 108b are secured to a floor 103 of the chassis 112. One or more support brackets 110a, 110b are attached to the mounting brackets 108a, 108b. The support brackets 110a, 110b are depicted in a first configuration where the support brackets 110a, 110b cover processors (not shown) that are installed on the circuit board 101 of the computing system 100.

Figure 2:
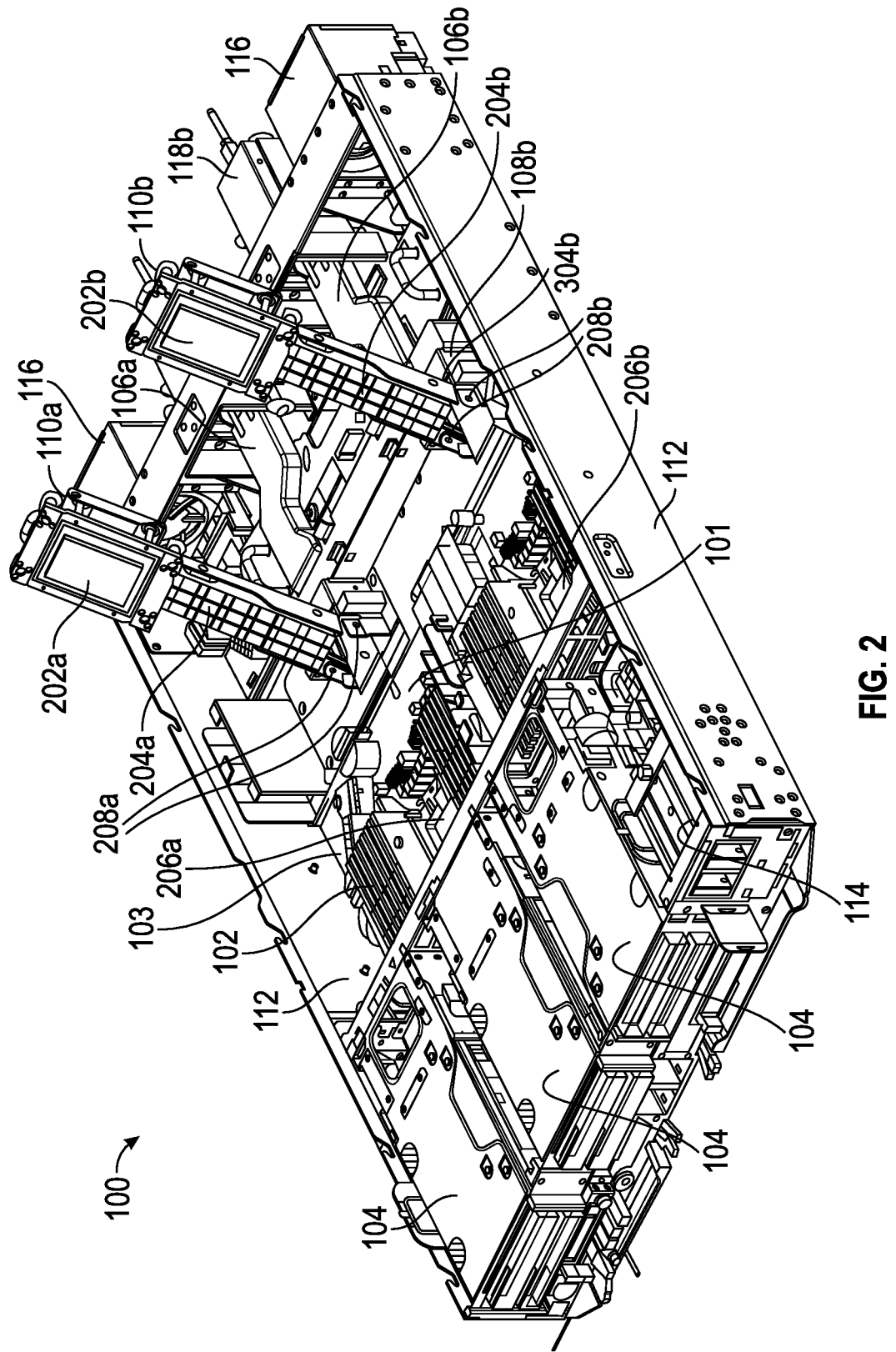
FIG. 2 is a perspective view showing the computing system of FIG. 1 with the support brackets in a second configuration, according to certain aspects of the present disclosure.

Referring to FIG. 2, the computing system 100 is shown with the support brackets 110a, 110b in a second configuration. In the second configuration, the support brackets 110a, 110b are lifted to expose processors 206a, 206b. The underside of the support brackets 110a, 110b includes pipe covers 204a, 204b and cold plates 202a, 202b, respectively. In an embodiment, the pipe covers 204a, 204b are removable from the support brackets 110a, 110b, respectively. To arrange the support brackets 110a, 110b from the first configuration of FIG. 1 to the second configuration of FIG. 2, the support brackets 110a, 110b are pivoted at pivot points 208a, 208b on the mounting bracket 108a, 108b. The pivot points 208a, 208b define pivot axes for rotating the support brackets 110a, 110b.

Figure 3:
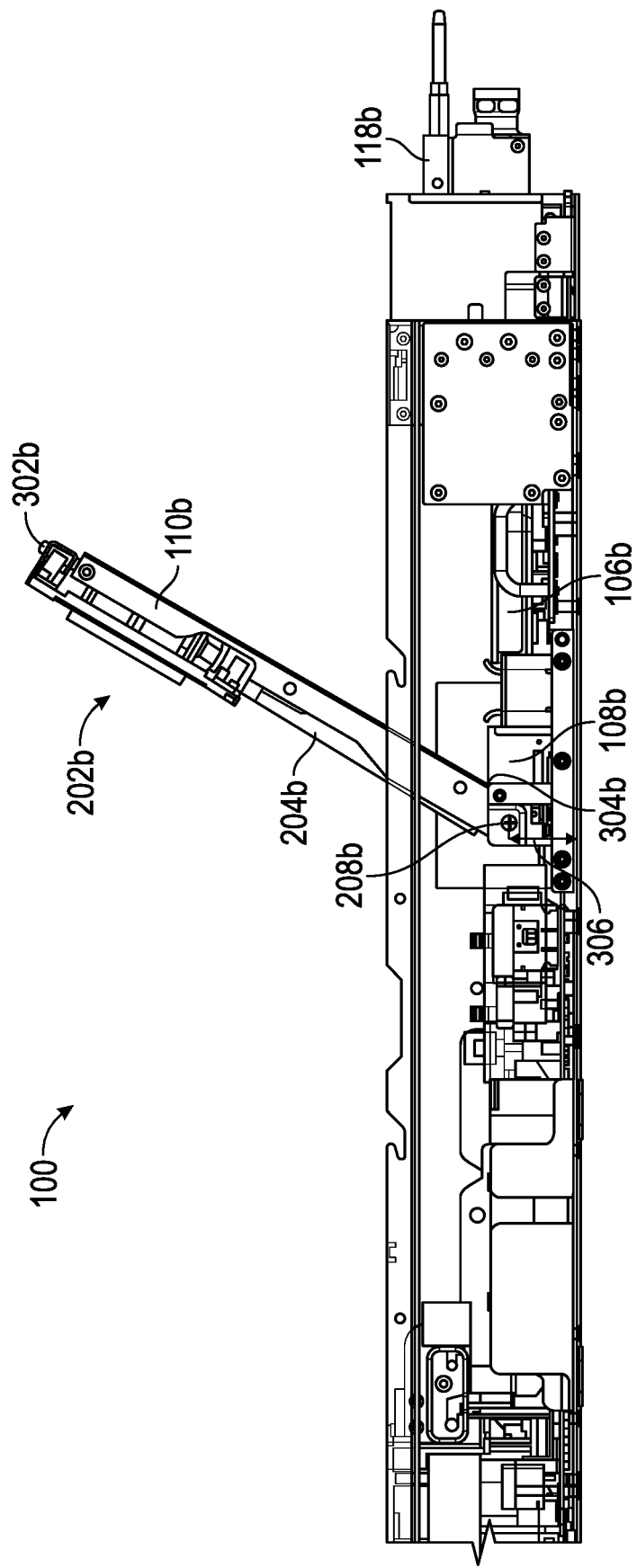
FIG. 3 is a side view of the computing system of FIG. 2, according to certain aspects of the present disclosure.

FIG. 3 shows a side view of the computing system 100 without the chassis 112. The pivot point 208b can include a screw, a bolt, or some other mechanical coupling device that allows the support bracket 110b to freely rotate. The pivot point 208b is provided a distance 306 from the floor 103 of the chassis 112. The distance 306 can take into account a thickness of the cold plate 202b so that when the support bracket 110b is in the first configuration, the cold plate 202b is parallel to the floor 103 of the chassis 112 and in contact with the processor 206b (FIG. 2). The support bracket 110b can have a handle 302b to facilitate pivoting the support bracket 110b when arranging the support bracket 110b in either the first or the second configuration. In some implementations, the support bracket 110b, when in the second configuration, rests on an edge 304b of the mounting bracket 108b. The edge 304b serves as a stopper to prevent the support bracket 110b from over-rotating when in the second configuration. Similarly, in some implementations, when in the first configuration, the support bracket 110b is prevented from over-rotating when the cold plate 202b makes contact with the processor 206b (FIG. 2).

In some implementations, the weight of the cold plate 202b is greater than that of the support bracket 110b so that a weight distribution along the support bracket 110b is heavily biased towards the location of the cold plate 202b. The mounting bracket 108b can include a damping mechanism at the pivot point 208b to control a pivot speed of the support bracket 110b when pivoting between the first and the second configurations. Examples of damping mechanisms include torsion springs, gears, etc. In an example, if the handle 302b slips from the hand of the support person while they are pivoting the support bracket 110b from the first configuration to the second configuration, then the damping mechanism can limit a maximum speed at which the cold plate 202b drops toward the processor 206b (FIG. 2). That is, the damping mechanism will counter some of the weight of the cold plate 202b so that the impact of dropping the cold plate 202b on the processor 206b (FIG. 2) is reduced.

In an example, if the handle 302b slips from the hand of the support person while they are pivoting the support bracket 110b from the first configuration to the second configuration, then the damping mechanism can restrict the pivot motion of the support bracket 110b. In an embodiment, the damping mechanism introduces multiple stable intermediate configurations between the first and second configurations. The damping mechanism can include a gear that maintains at least one of the multiple stable intermediate configurations such that a force from the support person is needed to move the support bracket 110b toward (or away from) the first configuration or the second configuration. In this embodiment, the handle 302b slipping out of the hand of the support person will not result in the support bracket 110b dropping to the processor 206b. Instead, the damping mechanism holds the position of the support bracket 110b. In an embodiment, the damping mechanism defines the first and the second configurations such that a hard stop prevents over-rotation when in either the first configuration or the second configuration.

Figure 4:
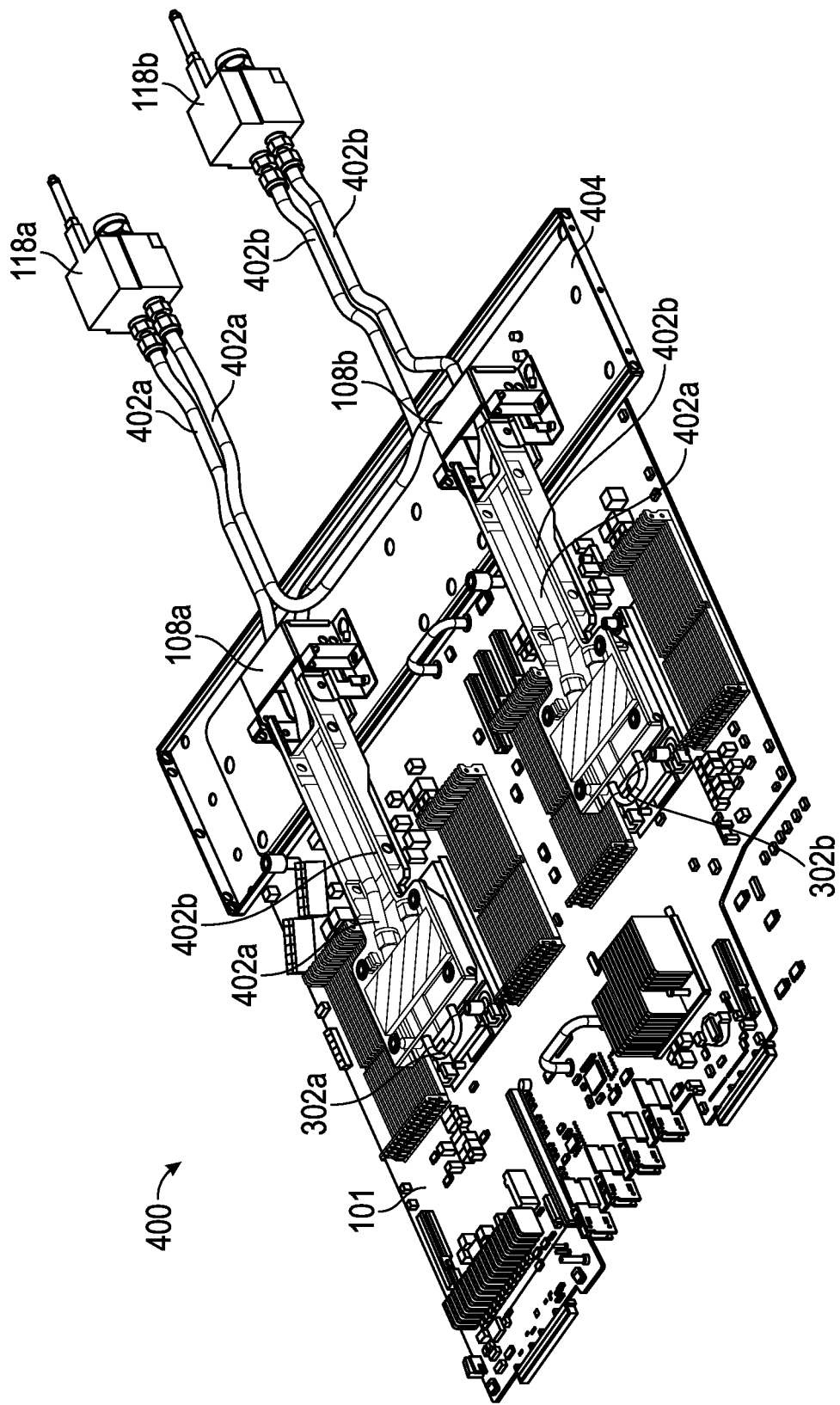
FIG. 4 is a perspective view of some components of the computing system of FIG. 1, according to certain aspects of the present disclosure.

FIG. 4 shows a perspective view of a portion 400 of the computing system 100 without the chassis 112. The portion 400 shows that in some implementations, the mounting brackets 108a, 108b are attached to a tray 404. The tray 404 can then be attached to the floor 103 of the chassis 112 (FIG. 1). In FIG. 4, the support brackets 110a, 110b (FIG. 1) are made transparent so that pipes 402a, 402b that carry liquid are visible. The pipes 402a, 402b are routed lengthwise through the support brackets 110a, 110b (FIG. 1) to the cold plates 202a, 202b (FIG. 3). In an embodiment, the pipe 402b is an inlet pipe that provides cold liquid to the cold plates 202a, 202b (FIG. 3), and the pipe 402a is an outlet pipe that extracts warm liquid from the cold plates 202a, 202b (FIG. 3). The pipe covers 204a, 204b (FIG. 2) can be provided to maintain the shape of the pipes 402a, 402b lengthwise along the support brackets 110a, 110b when the support brackets 110a, 110b are in the second configuration. That is, the pipe covers 204a, 204b (FIG. 2) allow the pipes 402a, 402b to move with the support brackets 110a, 110b as the support brackets 110a, 110b are pivoted between the first and the second configurations.

Figure 5:
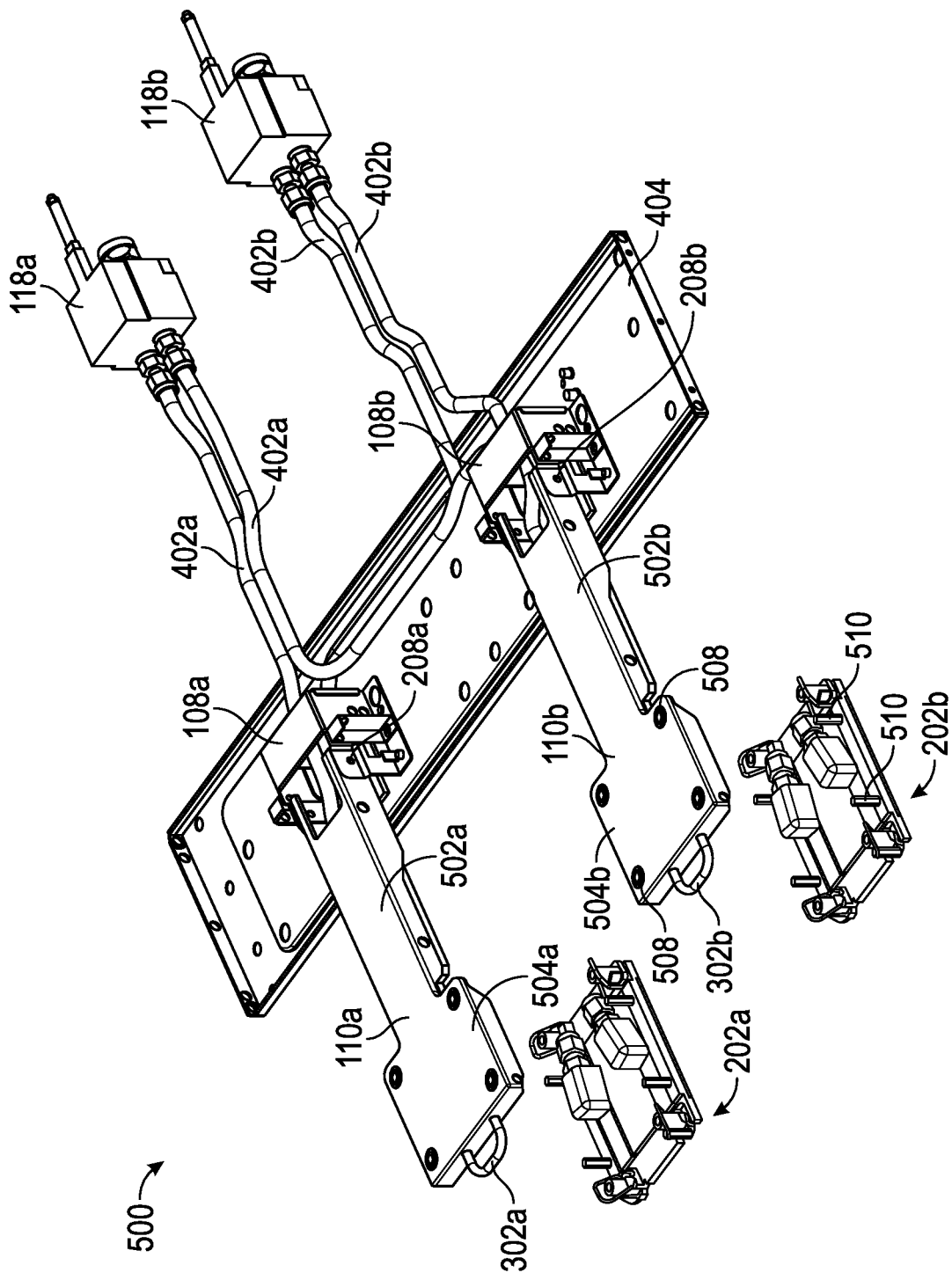
FIG. 5 is a perspective view showing cold plates of the computing system of FIG. 1 detached from support brackets.

FIG. 5 shows a perspective view of a portion 500 of the computing system 100 without the chassis 112 or the circuit board 101. The support brackets 110a, 110b are shown to have narrow frame portions 502a, 502b and wide frame portions 504a, 504b, respectively. The width of each of the narrow frame portions 502a, 502b accommodates the pipes 402a, 402b (FIG. 4) and is preferably not much wider than necessary for the pipes 402a, 402b (FIG. 4) to be routed within the support brackets 110a, 110b. Restricting the width of each of the narrow frame portions 502a, 502b as such better utilizes space within the chassis 112. The wide frame portions 504a, 504b provide a wider surface area to substantially match a footprint of the cold plates 202a, 202b. The cold plates 202a, 202b can interface with the wide frame portions 504a, 504b so that the cold plates 202a, 202b move with the support bracket 110b when placed in the first configuration of FIG. 1 or the second configuration of FIG. 2. The wider surface area of the wide frame portions 504a, 504b facilitates an easier coupling of the cold plates 202a, 202b and the wide frame portions 504a, 504b. In some implementations, the wider surface area can support a plurality of coupling locations across the wide frame portions 504a, 504b. Although shown to be rectangular, the wide frame portions 504a, 504b can take on other shapes (e.g., ellipses, circles, squares, etc.) to substantially match a shape of the footprint of the cold plates 202a, 202b.

Figure 6:
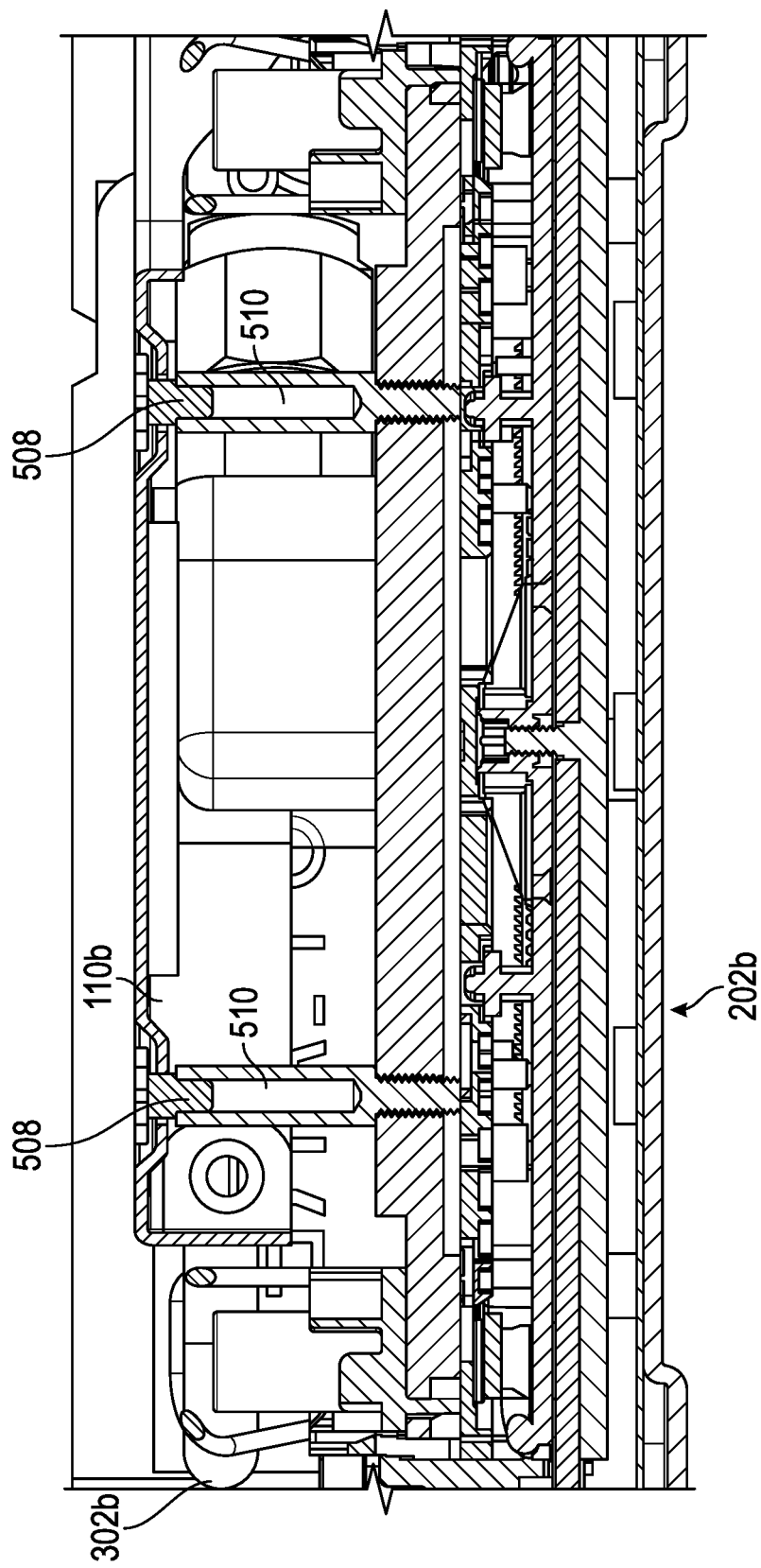
FIG. 6 is a cross sectional view of the computing system of FIG. 1, according to certain aspects of the present disclosure.

In an implementation, the cold plates 202a, 202b include flanges 510 to interface with the support brackets 110a, 110b. The flanges 510 can be inserted into pre-drilled holes in the support brackets 110a, 110b and then secured to the support brackets 110a, 110b. For example, FIG. 6 shows an example where the flanges 510 partially penetrate the support bracket 110b. Fasteners 508 (e.g., screws) are used to secure the flanges 510 to the support bracket 110b. That way, the cold plate 202b is coupled to the support bracket 110b. Other methods of securing the cold plate 202b to the support bracket 110 can be used.

Figure 7B:
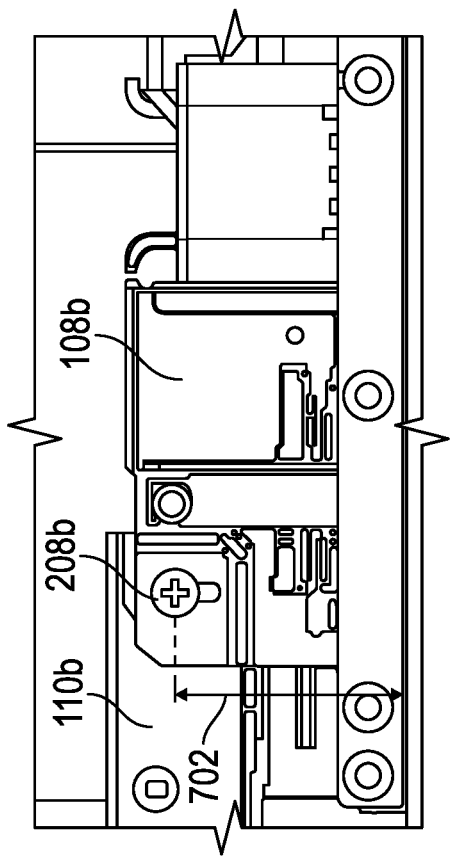
FIG. 7B is a zoomed-in portion of the computing system of FIG. 1, showing the pivot axis at a second height.
Figure 7A:
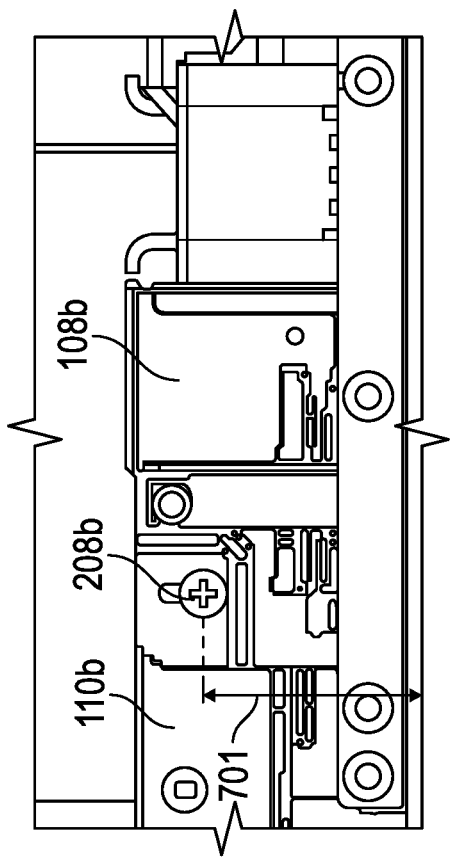
FIG. 7A is a zoomed-in portion of the computing system of FIG. 1 showing a pivot axis at a first height.

In some implementations, to account for manufacturing tolerance, the pivot axes of rotation are adjustable. FIG. 7A illustrates a zoomed-in portion of the computing system 100 where the pivot axis of rotation for the support bracket 110b is at a first height 701. FIG. 7B illustrates a zoomed-in portion of the computing system 100 where the pivot axis of rotation for the support bracket 110b is at a second height 702. The first height 701 is smaller than the second height 702. The tolerance provided by being able to move the pivot point 208b provides flexibility in thickness of cold plates that can be used with the support bracket 110b. The tolerance also provides flexibility to height of components being cooled by the cold plates. For example, an older processor with a height H1 is replaced with a newer processor with a height H2 that is different from the height H1. The tolerance allows adjusting the pivot point 208b to ensure that the cold plate 202b (FIG. 6) is parallel to the newer processor when in contact with the newer processor.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A computing system comprising:
   a chassis;
   a circuit board including at least one electronic component;
   a mounting bracket secured to the chassis;
   a support bracket pivotably coupled to the mounting bracket, the support bracket being pivotable between a first configuration and a second configuration, the support bracket including at least one frame portion positioned parallel to the circuit board in the first configuration and positioned at an angle relative to the circuit board in the second configuration; and
   a cold plate coupled to the support bracket at the at least one frame portion, the cold plate being in contact with the at least one electronic component and sandwiched between the at least one electronic component and the at least one frame portion in the first configuration, the cold plate being removed from contact with the at least one electronic component in the second configuration, wherein a top of the cold plate includes flanges that extend upward and penetrate the support bracket, the support bracket being secured to the flanges such the flanges are perpendicular to the at least one electronic component when the support bracket is in the first configuration.

2. The computing system of claim 1, wherein the mounting bracket is secured to a floor of the chassis.

3. The computing system of claim 1, wherein the mounting bracket includes an edge that prevents the support bracket from pivoting when pivoting the support bracket from the first configuration to the second configuration.

4. The computing system of claim 1, wherein the contact between the cold plate and the at least one electronic component prevents the support bracket from further rotating towards the circuit board when at the first configuration.

5. The computing system of claim 1, further comprising:
   an inlet pipe coupled to the cold plate; and
   an outlet pipe coupled to the cold plate, the inlet pipe and the outlet pipe routed lengthwise within the support bracket.

6. The computing system of claim 5, wherein the support bracket includes a pipe cover for holding the inlet pipe and the outlet pipe in place when the support bracket is pivoted between the first configuration and the second configuration, the pipe cover positioned between the circuit board and the inlet pipe and the outlet pipe.

7. The computing system of claim 1, wherein the at least one frame portion includes a narrow frame portion and a wide frame portion, the narrow frame portion and the wide frame portion being rectangular, the narrow frame portion having a width that is smaller than the width of the wide frame portion and having a length that is larger than the length of the wide frame portion.

8. The computing system of claim 7, wherein the cold plate is coupled to the support bracket at the wide frame portion of the support bracket.

9. The computing system of claim 1, wherein the support bracket is secured to the flanges via fasteners received by the flanges.

10. The computing system of claim 1, wherein a pivot axis of the support bracket is provided a distance from a floor of the chassis.

11. The computing system of claim 10, wherein a height of the pivot axis of the support bracket is adjustable to increase or decrease the distance from the floor of the chassis, the increase or decrease facilitating a varying thickness of the cold plate.

12. The computing system of claim 1, wherein the circuit board is a motherboard and the at least one electronic component is a processor.

13. The computing system of claim 1, wherein the support bracket includes a handle to facilitate pivoting the support bracket between the first configuration and the second configuration.

14. A method for installing a cold plate in a computing system, comprising:
   attaching the cold plate to a support bracket of the computing system, the cold plate being attached to at least one frame portion of the support bracket;
   pivotably coupling the support bracket of the computing system to a mounting bracket secured to a chassis of the computing system such that the support bracket is pivotable between a first configuration and a second configuration, wherein the cold plate is in contact with at least one electronic component positioned on a circuit board of the computing system and sandwiched between the at least one electronic component and the at least one frame portion when the support bracket is in the first configuration and the cold plate is removed from contact with the at least one electronic component of the computing system when the support bracket is in the second configuration, wherein the at least one frame portion is parallel to the circuit board in the first configuration and angled toward the circuit board in the second configuration, and wherein a top surface of the cold plate includes flanges that extend upward and penetrate the support bracket, the support bracket being secured to the flanges such the flanges are perpendicular to the at least one electronic component when the support bracket is in the first configuration; and routing an inlet pipe and an outlet pipe to the cold plate, the inlet pipe and the outlet pipe being routed along a length of the support bracket.

15. The method of claim 14, wherein coupling the cold plate to the support bracket of the computing system comprises:
positioning the support bracket at a distance from a floor of the chassis of the computing system; and
securing the support bracket to the mounting bracket with at least one fastener.

16. The method of claim 15, wherein the distance from the floor of the chassis is adjustable by changing a position of the at least one fastener.

17. The method of claim 16, wherein adjusting the distance from the floor of the chassis changes a height of a pivot axis of the support bracket.

18. The method of claim 14, wherein the support bracket includes a handle to facilitate pivoting the support bracket between the first configuration and the second configuration.

19. The method of claim 14, wherein the mounting bracket includes an edge that prevents the support bracket from pivoting when configuring the support bracket from the first configuration to the second configuration.

20. The method of claim 14, wherein the inlet pipe and the outlet pipe are bendable and remain routed along the length of the support bracket when the support bracket is in the first configuration and when the support bracket is in the second configuration.

* * * * *